Dec. 26, 1967 K. WARTENBERG 3,360,408
METHOD OF PRODUCING SEMICONDUCTOR MATERIAL
USING A PHOSPHORUS NITRILE HALIDE
Filed Jan. 29, 1965

United States Patent Office 3,360,408
Patented Dec. 26, 1967

3,360,408

METHOD OF PRODUCING SEMICONDUCTOR MATERIAL USING A PHOSPHORUS NITRILE HALIDE

Klaus Wartenberg, Erlangen, Germany, assignor to Siemens-Schuckertwerke Aktiengesellschaft, Berlin-Siemensstadt, Germany, a corporation of Germany Filed Jan. 29, 1965, Ser. No. 428,940
Claims priority, application Germany, Feb. 1, 1964, S 89,316
3 Claims. (Cl. 148—174)

It is known to produce semiconductor materials, such as germanium and silicon, by deposition of semiconductor material upon a heated carrier body of the same semiconductor material by pyrolytic dissociation or chemical reaction from a gaseous compound of the semiconductor material. The semiconductor material is precipitated preferably from a gas mixture, consisting of the gaseous compound of the semiconductor material and a carrier gas which may also act as a reaction partner, for example as a reducing agent. Hydrogen was found particularly effective for this purpose. The gasous compounds of the semiconductor material may, for example, comprise halides such as, for example, silicontetrachloride or siliconchloroform or corresponding germanium compounds. This type of process is known, for instance, from U.S. Patent No. 3,099,534 of Schweickert et al.

The semiconductor material may also be deposited on monocrystalline carrier rods with the deposited semiconductor material also growing monocrystalline. The carrier bodies can be heated by direct current passage, but they can also be heated by inductive heating or heat irradiation. It has also been suggested to precipitate doped monocrystalline semicondutcor material, whereby the doping material is admixed to the gas mixture in the form of chemical compounds. Phosphorus trichloride and boron trichloride were used as the doping material.

My invention relates to an improvement of such known methods, particularly to the exactness of the doping level to be achieved. It, therefore, concerns a method to produce semiconductor material, particularly silicon, wherein the semiconductor material consists of a mixture of a gaseous compound composed of the semiconductor material and a carrier gas, particularly hydrogen. This is to be done by means of reaction, particularly through reduction, on a heated carrier body, particularly a monocrystal of the same semiconductor material and deposited in the reaction chamber, with a contaminating material in the form of a chemical compound being added to the mixture. According to my invention, a portion of the gas mixture is passed over a phosphorous nitrile halide, prior to its entrance into the reaction chamber. Preferably, a part of the carrier gas is led over the phosphous nitrile halide.

My invention makes possible obtaining an even doping even over longer precipitation periods. This is particularly important if, after monocrystalline precipitation of the semiconductor material, the resulting semiconductor bodies are only to be divided and then further processed into semiconductor devices. It had been necessary, in the case of semiconductor material obtained by precipitation from the gaseous phase, to zone melt the rod to equalize the doping, since the doping level over the rod cross section was not adequately even.

Figure 1:
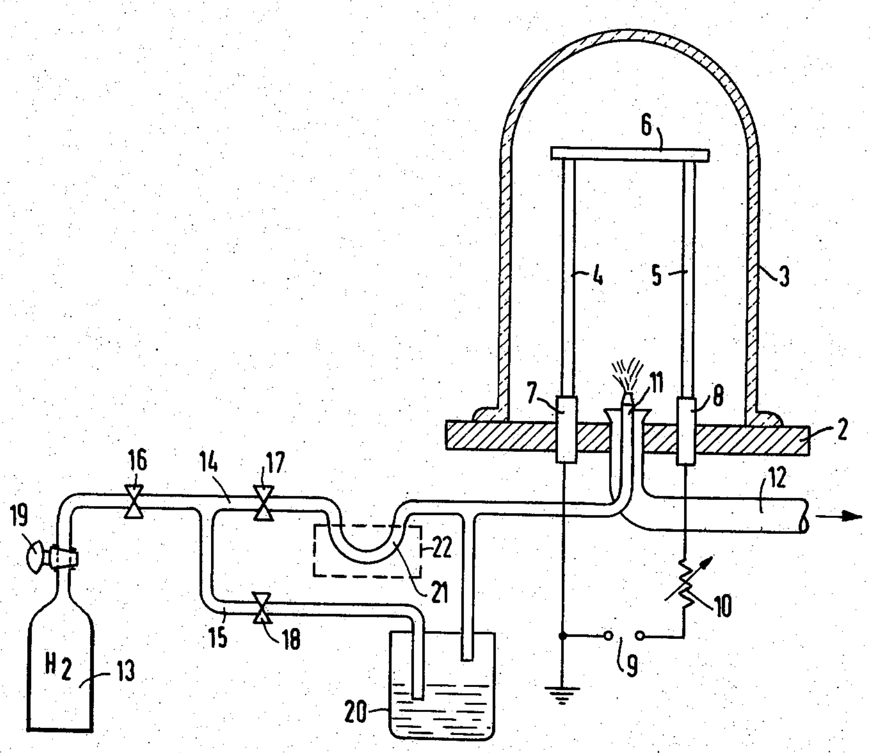
Figure 2:
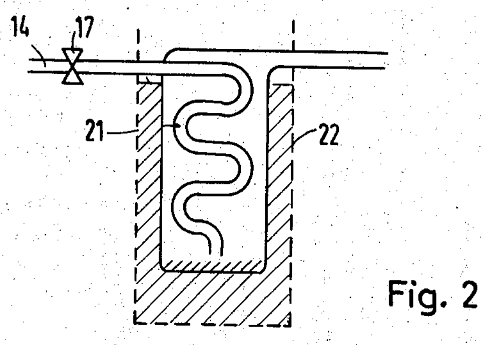

The drawing illustrates in FIG. 1 an apparatus for executing the invented method, and in FIG. 2 a specific detail of said apparatus.

The following example will show additional advantages and details of the invention.

Two semiconductor rods 4 and 5 are arranged perpendicularly in a reaction vessel, which may consist of a metal base plate 2 and a quartz bell 3. The rods are connected by a current conducting bridge 6, which may also consist of semiconductor material but also of pure graphite or "spectral carbon." Two leads 7 and 8 extend through the base plate 2, one of which may be conductively connected with the base plate 2, while the other is insulated from the base plate 2. Both leads 7 and 8 are connected to a current source 9 which may be adjusted by means of an adjustable resistance 10. Direct or/and alternating current may be provided. A nozzle 11 extends into the reaction vessel, for the purpose of supplying a fresh gas current, while an exhaust gas outlet 12 serves to remove the remaining gas.

The fresh gas may consist, for example, of hydrogen enriched with silicon tetrachloride or silicon chloroform. The hydrogen gas emerges from a bottle 13 and flows through conduits 14, 15, to the nozzle 11. The amount of the gas flowing through conduits 14 and 15 may be exactly adjusted by means of appropriate valves 16, 17 and 18. Valve 19 at the gas bottle 13 is for completely disconnecting the gas flow. The hydrogen, which flows through tube 15, reaches a vessel 20 wherein the gas is charged with silicon chloroform. Thus, for example, the hydrogen current may pass over the silicon chloroform or bubble through the same. The ratio between the absorbed silicon chloroform and the hydrogen serving as a carrier gas is usually adjusted in such a way that the ratio of silicon chloroform to hydrogen is from 0.03:1 to 0.3:1. Of course, various deviations from the indicated values are possible, according to the purpose of usage. Up to this point prior art technique and apparatus have been described.

According to my invention, a portion of the hydrogen current, i.e. the portion flowing through tube 14 is led over a phosphonitrile halide. This phosphonitrile halide is located in tube 14 preferably in a trap such as 21. A casing 22 may be provided at location 21 which makes possible an exact adjustment of the phosphorous nitrile halide temperature. Naturally, the gas mixture containing the semiconductor compound may also be led over the phosphonitrile halide. However, it is advantageous to pass a portion of the carrier gas only over the phosphonitrile halide, since this provides a more accurate adjustment.

The low-polymer phosphonitrile halides, such as $(PNCl_2)_3$, $(PNF_2)_3$, $(PNBr_2)_3$, $(PNCl_2)_4$, $(PNBr_2)_4$, are solid crystals, at room temperature, which do not give off dust and have a relatively high vapor pressure; higher polymers are oily to rubbery. The low polymers can be very easily cleaned and are, therefore, particularly well suited for doping purposes. Furthermore, they are free of carbon and they are not hygroscopic at room temperature.

Using a highly purified silicon cholorform, such as is normally used to obtain silicon of high purity, for example with a specific resistance of about 1,000 ohm cm., one can achieve an even phosphorus doping with a resultant specific resistance of 0.02 ohm cm.; by passing, at a total weight rate of flow of 700 liters/hour, about $\frac{1}{10}$ of the hydrogen over trimer phosphonitrile chloride $(PNCl_2)_3$ maintained at room temperature. Cooling the phosphonitrile halide to temperatures below 0° C. results in correspondingly smaller dopings. For example, at 0° C., a specific resistance of 0.3 ohm cm. is obtained. In this case too, the doping is completely homogeneous during the entire precipitation period, which may extend over hours. The growing monocrystals usually have the form of hexagonal rods and are homogeneously doped along their length as well as over the cross section.

It is also advantageous that the purity of the gas used, i.e. the hydrogen and the semiconductor compound, is such that without doping, the specific resistance of the deposited semiconductor material would be higher by the factor 10, than if precipitation would take place with doping. According to the above example, in which silicon choloroform which normally leads to semiconductor material of very high purity (1000 ohm cm.) is used, doped material with a specific resistance of 50 to 100 ohm cm. may be obtained. If a lower doping is sought, the original materials do not have to be so highly purified, however.

FIG. 2 shows a device which is particularly suitable, at low temperatures, for enriching the hydrogen flow in conduit 14 with phosphonitrile halide. Casing 22 represents a cooling device by which the hydrogen flow is cooled along with the doping material.

The invented method may, of course, be applied in a broad scope. For example, with the aid of phosphonitrle halides such as $(PNCl_2)_3$, n-doped epitactic layers can be precipitated on semiconductor discs. The method conditions and corresponding apparatus for epitactic layers may be appropriately varied.

I claim:

1. In the method of producing semiconductor material by pyrolytic precipitation of semiconductor material, upon a monocrystalline heated carrier body of the same semiconductor material, from a gaseous reaction mixture of a compound of the semiconductor material and hydrogen, the improvement which comprises passing a portion of the gaseous reaction mixture over phosphonitrile halide, prior to introducing the gaseous reaction mixture to the reaction chamber.

2. In the method of producing semiconductor material by pyrolytic precipitation of semiconductor material, upon a monocrystalline heated carrier body of the same semiconductor material, from a gaseous reaction mixture of a compound of the semiconductor material and hydrogen, the improvement which comprises passing a portion of the gaseous reaction mixture over cooled phosphonitrile halide, prior to introducing the gaseous reaction mixture to the reaction chamber.

3. In the method of producing semiconductor silicon by pyrolytic precipitation of semiconductor silicon, upon a monocrystalline heated silicon carrier body, from a gaseous reaction mixture of silicon chloroform and hydrogen, the improvement which comprises passing a portion of the gaseous reaction mixture of trimer phosphonitrile chloride, prior to introducing the gaseous reaction mixture to the reaction chamber.

References Cited

UNITED STATES PATENTS 3,168,422 2/1965 Allegretti et al. ------ 148—175

DAVID L. RECK, *Primary Examiner.*

N. F. MARKVA, *Assistant Examiner.*